(12) United States Patent
Park et al.

(10) Patent No.: US 10,566,389 B2
(45) Date of Patent: Feb. 18, 2020

(54) MULTI-NEGATIVE DIFFERENTIAL RESISTANCE DEVICE AND METHOD OF MANUFACTURING THE SAME

(71) Applicant: Research & Business Foundation Sungkyunkwan University, Suwon-si (KR)

(72) Inventors: Jin Hong Park, Hwaseong-si (KR); Jaewoo Shim, Bucheon-si (KR); Hae Won Lee, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/005,967

(22) Filed: Jun. 12, 2018

(65) Prior Publication Data
US 2018/0358412 A1    Dec. 13, 2018

(30) Foreign Application Priority Data

Jun. 12, 2017  (KR) .................. 10-2017-0073336

(51) Int. Cl.
*H01L 27/26* (2006.01)
*H01L 47/00* (2006.01)
*H01L 47/02* (2006.01)

(52) U.S. Cl.
CPC ............ *H01L 27/265* (2013.01); *H01L 27/26* (2013.01); *H01L 47/005* (2013.01); *H01L 47/026* (2013.01)

(58) Field of Classification Search
CPC ...................................................... H01L 27/265
See application file for complete search history.

(56) References Cited

U.S. PATENT DOCUMENTS 5,981,969 A * 11/1999 Yuan ...................... B82Y 10/00
257/183

FOREIGN PATENT DOCUMENTS

| JP | 3420972 B2 | 6/2003 |
| KR | 10-2015-0037866 A | 12/2013 |
| KR | 10-2015-0037866 A | 4/2015 |

OTHER PUBLICATIONS

Sunhae Shin et al., "Negative Differential Resistance Devices with Ultra-High Peak-to-Valley Current Ratio and Its Multiple Switching Characteristics," *Journal of Semiconductor Technology and Science*, vol. 13, No. 6, Dec. 2013( 6 pages in English).

* cited by examiner

*Primary Examiner* — William A Harriston
(74) *Attorney, Agent, or Firm* — NSIP Law

(57) ABSTRACT

Provided is a multi-negative differential resistance device. The multi-negative differential resistance device includes a first negative differential resistance device and a second negative differential resistance device connected in parallel with the first negative differential resistance device, and a peak and a valley of the first negative differential resistance device and a peak and a valley of the second negative differential resistance device are synthesized, and, thus, the multi-negative differential resistance device has two peaks and two valleys.

11 Claims, 10 Drawing Sheets

MULTI-NEGATIVE DIFFERENTIAL RESISTANCE DEVICE AND METHOD OF MANUFACTURING THE SAME

CROSS-REFERENCE TO RELATED APPLICATION

This application claims the benefit of Korean Patent Application No. 10-2017-0073336 filed on Jun. 12, 2017, the entire disclosures of which are incorporated herein by reference.

TECHNICAL FIELD

The present disclosure relates to a multi-negative differential resistance device and a method of manufacturing the same.

BACKGROUND

In a negative differential resistance (NDR) device in contrast to typical resistance devices, the current decreases despite an increase in the voltage applied. That is, the current decreases as the voltage increases. Therefore, the voltage-current curve has an "N" shape, and, thus, the NDR device shows characteristics of diodes with various threshold voltages. Accordingly, the NDR device can be used to implement a multi-valued logic circuit which can display various logic states.

The NDR device is generally known as being observed in an Esaki diode, a resonant tunneling diode, a single electron transistor, a molecular device, and the like. In the Esaki diode which can be implemented with a heavily doped PN junction, when a voltage having a predetermined value or more is applied, a diffusion current mainly affects an operation of the Esaki diode, and, thus, a negative differential resistance characteristic with a peak and a valley can be observed. Meanwhile, it is known that the resonant tunneling diode, the single electron transistor, the molecular device, and the like can be used to implement a negative differential resistance characteristic with multiple peaks and multiple valleys. However, most of them are difficult to be commercialized due to the stability of logic stages (very small voltage difference between states due to low energy level difference) and limitation on operating temperature (being operable only at a low temperature of 100 K or less due to effects on a thermionic electron emission current).

In regard to a device with NDR characteristics, Korean Patent Laid-open Publication No. 2013-0138045 (entitled "NDR semiconductor device and production process thereof") discloses an NDR device that can achieve a high PVCR (Peak-to-Valley Current Ratio) with a simple structure in which a transistor is combined with an existing Esaki tunnel diode and has multi-peak current.

SUMMARY

In view of the foregoing, the present disclosure provides a negative differential resistance device with multiple peaks by connecting a negative differential resistance device with a peak and a valley to a resistance in series and connecting circuits each including a negative differential resistance device and a resistance in parallel.

However, problems to be solved by the present disclosure are not limited to the above-described problems. There may be other problems to be solved by the present disclosure.

An aspect of the present disclosure provides a multi-negative differential resistance device including a first negative differential resistance device and a second negative differential resistance device connected in parallel with the first negative differential resistance device, and a peak and a valley of the first negative differential resistance device and a peak and a valley of the second negative differential resistance device are synthesized, and, thus, the multi-negative differential resistance device has two peaks and two valleys.

Another aspect of the present disclosure provides a multi-negative differential resistance device in which N number of negative differential resistance devices are connected in parallel with each other, and peaks and valleys of the respective negative differential resistance devices are synthesized, and, thus, the multi-negative differential resistance device has N number of peaks and valleys, and each of the negative differential resistance devices includes a degenerated p-type semiconductor and a degenerated n-type semiconductor joined together and a resistance device connected to any one of the degenerated p-type semiconductor and the degenerated n-type semiconductor.

Yet another aspect of the present disclosure provides a method of manufacturing a multi-negative differential resistance device including forming N (N is a natural number of 2 or more) number of degenerated first polar semiconductor layers on a substrate, forming N number of degenerated second polar semiconductor layers to be joined to the degenerated first polar semiconductor layers, forming N number of resistive layers to be adjacent to the second polar semiconductor layers, forming N number of first electrodes in contact with the first polar semiconductor layers, N number of second electrodes in contact between the second polar semiconductor layers and the resistive layers and N number of third electrodes in contact with the resistive layers, and connecting the N number of first electrodes in parallel with the N number of third electrodes, respectively.

Still another aspect of the present disclosure provides a method of manufacturing a multi-negative differential resistance device including forming N (N is a natural number of 2 or more) number of degenerated first polar semiconductor layers on a substrate, forming N number of second polar semiconductor layers to be joined to the degenerated first polar semiconductor layers, degenerating junction portions of the second polar semiconductor layers joined to the degenerated first polar semiconductor layers, forming N number of first electrodes in contact with the first polar semiconductor layers and N number of second electrodes in contact with non-degenerated portions of the second polar semiconductor layers, and connecting the N number of first electrodes in parallel with the N number of second electrodes, respectively.

In a negative differential resistance device according to an embodiment of the present disclosure, it is possible to easily implement a negative differential resistance device with multiple peaks by connecting negative differential resistance devices with a peak and a valley in parallel with each other and also possible to implement a multi-valued logic circuit which can display various logic states using a small number of devices.

Further, it is possible to implement a quaternary inverter circuit using a transistor, two negative differential resistance devices with a peak and a valley, and a resistance. Accordingly, it is possible to achieve miniaturization, low-energy consumption, and high-speed operation of a chip.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Hereinafter, embodiments of the present disclosure will be described in detail with reference to the accompanying drawings so that the present disclosure may be readily implemented by a person with ordinary skill in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, it is to be understood that the term "comprises or includes" and/or "comprising or including" used in the document means that one or more other components, steps, operation and/or existence or addition of elements are not excluded in addition to the described components, steps, operation and/or elements unless context dictates otherwise and is not intended to preclude the possibility that one or more other features, numbers, steps, operations, components, parts, or combinations thereof may exist or may be added.

Figure 1:
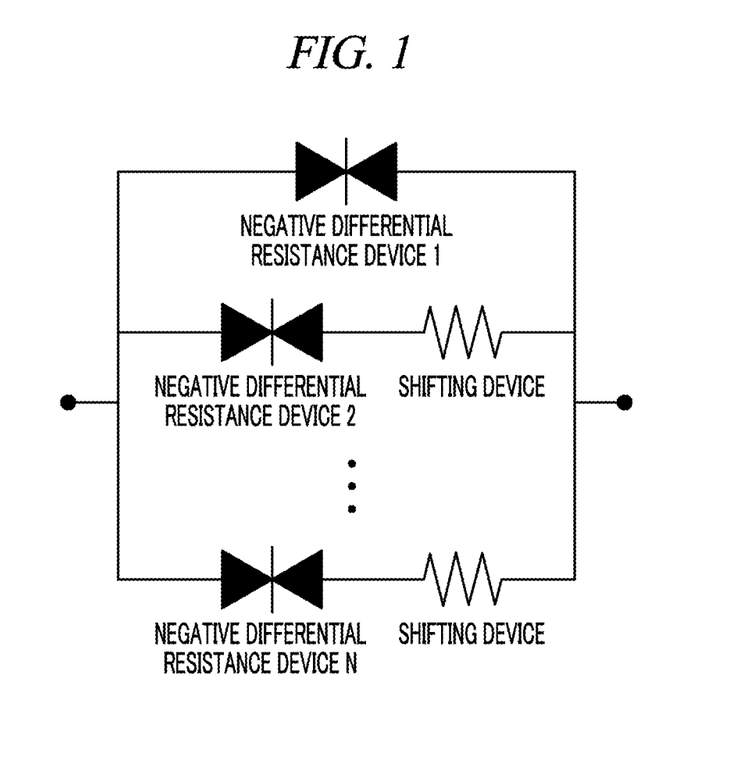
FIG. 1 is a circuit diagram of a multi-negative differential resistance device in accordance with various embodiments described herein.

FIG. 1 is a circuit diagram of a multi-negative differential resistance device in accordance with an embodiment of the present disclosure.

A multi-negative differential resistance device of the present disclosure includes a first negative differential resistance device and a second negative differential resistance device connected in parallel with the first negative differential resistance device, and a peak and a valley of the first negative differential resistance device and a peak and a valley of the second negative differential resistance device may be synthesized, and, thus, the multi-negative differential resistance device may have two peaks and two valleys.

As illustrated in FIG. 1, the multi-negative differential resistance device of the present disclosure is not limited to including two negative differential resistance devices and may include N (N is a natural number of 2 or more) number of negative differential resistance devices connected in parallel with each other and thus have N number of peaks and valleys. Accordingly, it is possible to easily implement a negative differential resistance device with multiple peaks by connecting negative differential resistance devices with a peak and a valley in parallel with each other and also possible to implement a multi-valued logic circuit which can display various logic states using a small number of devices.

Figure 2:
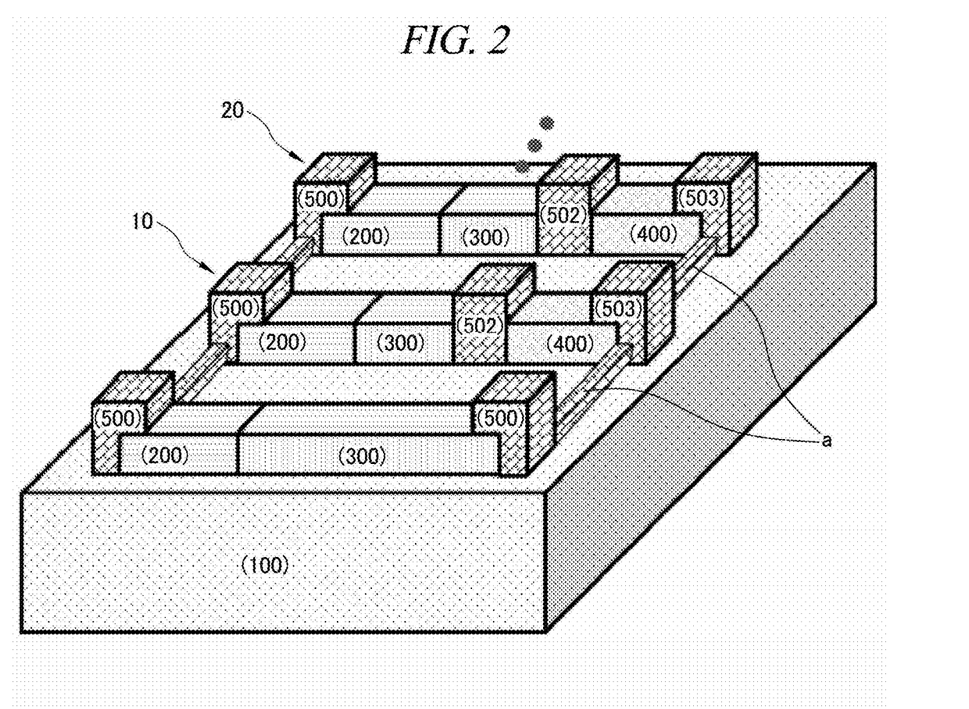
FIG. 2 is a perspective view of a multi-negative differential resistance device in accordance with various embodiments described herein.

FIG. 2 is a perspective view of a multi-negative differential resistance device in accordance with an embodiment of the present disclosure.

Figure 3:
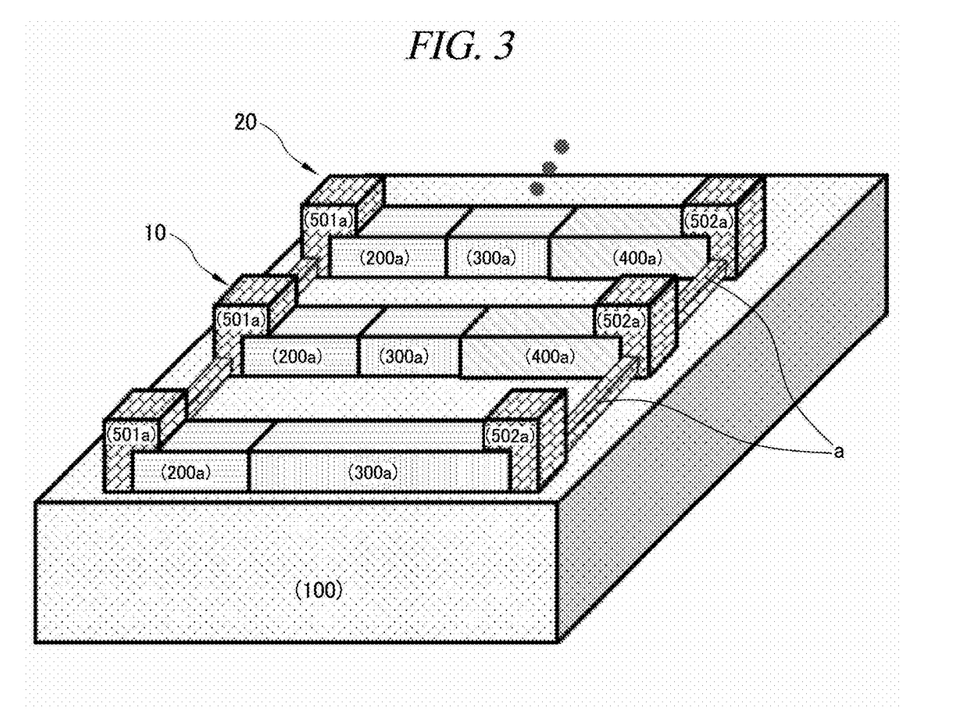
FIG. 3 is a perspective view of a multi-negative differential resistance device in accordance with various embodiments described herein.

FIG. 3 is a perspective view of a multi-negative differential resistance device in accordance with another embodiment of the present disclosure.

Referring to FIG. 2 and FIG. 3, first negative differential resistance devices 10 and 10a and second negative differential resistance devices 20 and 20a include degenerated first polar semiconductors 200 and 200a and degenerated second polar semiconductors 300 and 300a joined together, and resistance devices 400 and 400a connected to any one of the degenerated first polar semiconductors 200 and 200a and the degenerated second polar semiconductors 300 and 300a, respectively.

Herein, the degenerated first polar semiconductors 200 and 200a may be n-type semiconductors and formed to have a higher Fermi level than a conduction band due to their very high impurity concentration, and the degenerated second polar semiconductors 300 and 300a may be p-type semiconductors and formed to have a lower Fermi level than a valence band due to their very high impurity concentration. In this case, the impurity concentration for forming the degenerated semiconductors 200, 200a, 300, and 300a may be $10^{19}$ cm$^{-3}$ or more for silicon (Si), $10^{18}$ cm$^{-3}$ or more for germanium (Ge), and $10^{17}$ cm$^{-3}$ or more for gallium arsenide (GaAs).

Further, as illustrated in FIG. 2 and FIG. 3, the degenerated first polar semiconductors 200 and 200a may be degenerated p-type semiconductors and the degenerated second polar semiconductors 300 and 300a may be degenerated n-type semiconductors, but may not be limited thereto. The degenerated first polar semiconductors 200 and 200a may be degenerated n-type semiconductors and the degenerated second polar semiconductors 300 and 300a may be degenerated p-type semiconductors.

For example, referring to FIG. 1 and FIG. 2, the resistance devices 400 and 400a may generate a resistance using metal and semiconductor thin films (passive devices) and thus may be used as shifting devices. Further, active devices such as a PN junction-based diode or a metal-semiconductor junction-based diode, a bipolar junction transistor, and a field effect transistor can be used as shifting devices.

An example of the multi-negative differential resistance device of the present disclosure will be described with reference to FIG. 2.

However, the multi-negative differential resistance device to be described below is just an example of the present disclosure and can be modified in various ways based on its components.

As illustrated in FIG. 2, a first negative differential resistance device 10 includes a first electrode 501, a second electrode 502, a third electrode 503, a degenerated p-type semiconductor 200 and a degenerated n-type semiconductor 300 arranged between the first electrode 501 and the second electrode 502 and joined together, and a resistance device 400 arranged between the second electrode 502 and the third electrode 503. A second negative differential resistance device 20 includes a first electrode 501, a second electrode 502, a third electrode 503, a degenerated p-type semiconductor 200 and a degenerated n-type semiconductor 300 arranged between the first electrode 501 and the second electrode 502 and joined together, and a resistance device 400 arranged between the second electrode 502 and the third electrode 503.

In this case, the first electrode 501 of the first negative differential resistance device 10 and the first electrode 501 of the second negative differential resistance device 20 may be electrically connected through an electric wire a, and the third electrode 503 of the first negative differential resistance device 10 and the third electrode 503 of the second negative differential resistance device 20 may be electrically connected through an electric wire a.

Herein, the degenerated p-type semiconductor 200 may be formed of at least one of silicon, germanium (Ge), semiconductors of elements from Groups III-V of the periodic table, oxide semiconductors, organic semiconductors, transition metal dichalcogenide, and phosphorene, but may not be limited thereto.

Further, the degenerated n-type semiconductor 300 may be formed of at least one of silicon, germanium (Ge), semiconductors of elements from Groups III-V of the periodic table, oxide semiconductors, organic semiconductors, and transition metal dichalcogenide, but may not be limited thereto.

Another example of the multi-negative differential resistance device of the present disclosure will be described with reference to FIG. 3.

As illustrated in FIG. 3, a first negative differential resistance device 10a includes a first electrode 501a, a second electrode 502a, a degenerated p-type semiconductor 200a, a degenerated n-type semiconductor 300a and a resistance device 400a arranged between the first electrode 501a and the second electrode 502a and joined together. A second negative differential resistance device 20a includes a first electrode 501a, a second electrode 502a, a degenerated p-type semiconductor 200a, a degenerated n-type semiconductor 300a and a resistance device 400a arranged between the first electrode 501a and the second electrode 502a and joined together.

In this case, the first electrode 501a of the first negative differential resistance device 10a and the first electrode 501a of the second negative differential resistance device 20a may be electrically connected through an electric wire a, and the second electrode 502a of the first negative differential resistance device 10a and the second electrode 502a of the second negative differential resistance device 20a may be electrically connected through an electric wire a.

Herein, the degenerated n-type semiconductor 300a and the resistance device 400a may be formed by degenerating a junction portion of the n-type semiconductor 300a joined to the degenerated p-type semiconductor 200a.

Further, in the multi-negative differential resistance device, N number of negative differential resistance devices 10, 20, 10a, and 20a are connected in parallel with each other, and peaks and valleys of the respective negative differential resistance devices 10 to 20a are synthesized, and, thus, the multi-negative differential resistance device has N number of peaks and valleys, and each of the negative differential resistance devices 10 to 20a may include a degenerated p-type semiconductor 200 or 200a and a degenerated n-type semiconductor 300 or 300a joined together and a resistance device 400 or 400a connected to any one of the degenerated p-type semiconductors 200 and 200a and the degenerated n-type semiconductors 300 and 300a.

Hereinafter, a method of manufacturing the multi-negative differential resistance device of the present disclosure will be described in detail.

Figure 4:
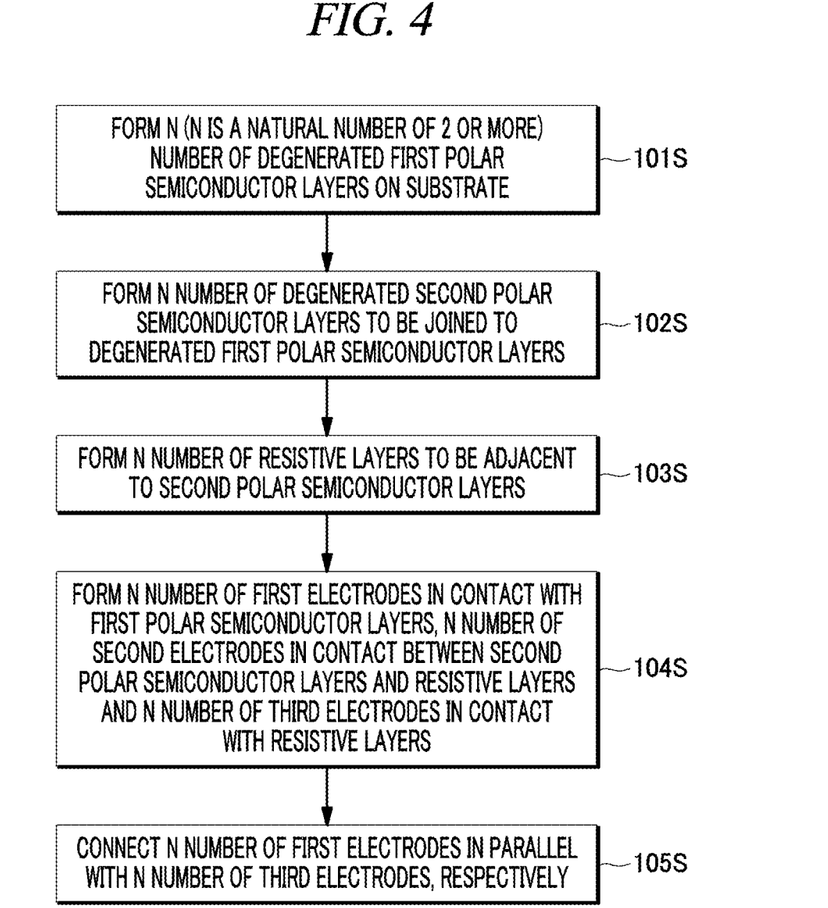
FIG. 4 is a flowchart provided to explain a method of manufacturing the multi-negative differential resistance device illustrated in FIG. 2.

FIG. 4 is a flowchart provided to explain a method of manufacturing the multi-negative differential resistance device illustrated in FIG. 2.

FIG. 5A to FIG. 5D illustrate a detailed process provided to explain the method of manufacturing a multi-negative differential resistance device illustrated in FIG. 4.

Figure 5A:
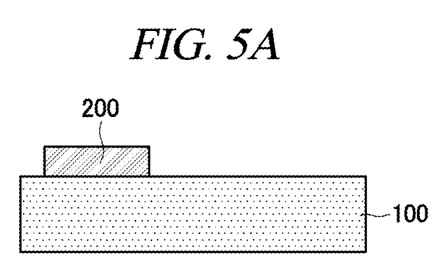
FIG. 5A illustrates a detailed process provided to explain the method of manufacturing a multi-negative differential resistance device illustrated in FIG. 4.
Figure 5B:
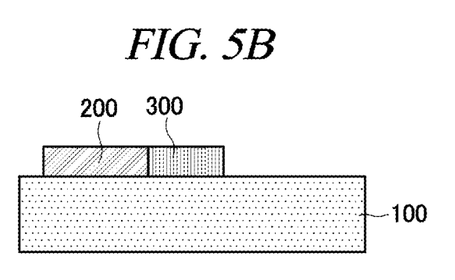
FIG. 5B illustrates a detailed process provided to explain the method of manufacturing a multi-negative differential resistance device illustrated in FIG. 4.
Figure 5C:
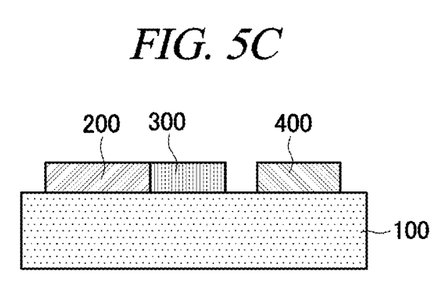
FIG. 5C illustrates a detailed process provided to explain the method of manufacturing a multi-negative differential resistance device illustrated in FIG. 4.
Figure 5D:
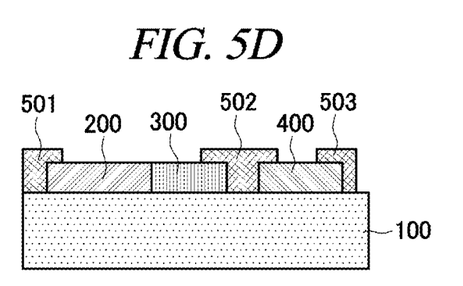
FIG. 5D illustrates a detailed process provided to explain the method of manufacturing a multi-negative differential resistance device illustrated in FIG. 4.

Referring to FIG. 4 to FIG. 5D, the method of manufacturing a multi-negative differential resistance device according to an embodiment of the present disclosure includes forming N (N is a natural number of 2 or more) number of degenerated first polar semiconductor layers 200 on a substrate 100 (S101), forming N number of degenerated second polar semiconductor layers 300 to be joined to the degenerated first polar semiconductor layers 200 (S102), forming N number of resistive layers 400 to be adjacent to the second polar semiconductor layers 300 (S103), forming N number of first electrodes 501 in contact with the first polar semiconductor layers 200, N number of second electrodes 502 in contact between the second polar semiconductor layers 300 and the resistive layers 400 and N number of third electrodes 503 in contact with the resistive layers 400 (S104), and connecting the N number of first electrodes 501 in parallel with the N number of third electrodes 503, respectively (S105).

For example, a method of manufacturing multi-negative differential resistance devices 10 and 20 with N number of (i.e., two) peaks and valleys will be described with reference to FIG. 2, FIG. 4, and FIG. 5A to FIG. 5D. In S101, N number of degenerated p-type semiconductors 200 may be formed on the substrate 100 as illustrated in FIG. 2 and FIG. 5A. That is, degenerated p-type semiconductors 200 may be arranged in parallel with each other as illustrated in FIG. 2. Then, in S102, degenerated n-type semiconductors 300 may be formed at one ends of the p-type semiconductors 200 or on the p-type semiconductors 200 to be joined to the p-type semiconductors 200 as illustrated in FIG. 2 and FIG. 5B. In this case, S102 may be performed prior to S101.

For example, the substrate 100 may be formed of at least one of silicon (Si) on which an insulating layer such as silicon dioxide ($SiO_2$), aluminum oxide ($Al_2O_3$), or hafnium oxide ($HfO_2$) is grown or deposited, a germanium (Ge) substrate, glass, and a PET film, but may not be limited thereto.

The degenerated p-type semiconductor 200 may be formed to have various thicknesses of from several ten nm to several hundred μm and may be formed using any semiconductor material, such as silicon, germanium, Group III-V semiconductors, oxide semiconductors, organic semiconductors, transition metal dichalcogenide, or phosphorene, operating in p-type. The p-type semiconductor 200 formed of silicon, germanium, Group III-V semiconductors, oxide semiconductors, or organic semiconductors may be formed by thermal evaporation, e-beam evaporation, sputtering, or chemical vapor deposition, and the p-type semiconductor 200 formed of a 2-dimensional semiconductor material such as transition metal dichalcogenide and phosphorene may be grown and formed by delamination using a tape and chemical vacuum deposition such as CVD (chemical vapor deposition). In this case, degenerated semiconductor layers may be formed using a semiconductor material present in a naturally degenerated form such as phosphorene in bulk or using an in-situ doping method when semiconductor layers are grown or deposited.

Further, the degenerated n-type semiconductor 300 may be formed to have various thicknesses of from several ten nm to several hundred μm and may be formed using any semiconductor material, such as silicon, germanium, Group III-V semiconductors, oxide semiconductors, organic semiconductors, or transition metal dichalcogenide, operating in n-type. The n-type semiconductor 300 may be formed using a semiconductor material present in a naturally degenerated form such as rhenium disulfide ($ReS_2$) in bulk or using the same method as that used for the degenerated p-type semiconductor 200.

Then, in S103, N number of serial resistive thin films (resistive layers 400) may be formed to be adjacent to the n-type semiconductors 300 as illustrated in FIG. 2 and FIG. 5C. For example, the serial resistive thin films 400 may be formed of generally used degenerated polycrystalline n-type or p-type silicon, metal thin film, carbon thin film, or the like.

Then, in S104, N number of first electrodes 501 in contact with the p-type semiconductors 200, N number of second electrodes 502 in contact between the n-type semiconductors 300 and the serial resistive thin films 400 which are the resistive layers, and N number of third electrodes 503 in contact with the resistive thin films 400 may be formed as illustrated in FIG. 2 and FIG. 5D. For example, the first electrodes 501 may be formed using a metal, such as platinum (Pt) or palladium (Pd), having a high work function to reduce a contact resistance with respect to the p-type semiconductors 200. The second electrodes 502 may be formed using a metal, such as titanium (Ti) or aluminum (Al), having a low work function to reduce a contact resistance with respect to the n-type semiconductors 300. The first to third electrodes 501 to 503 may be deposited by thermal evaporation, e-beam evaporation, sputtering, or chemical vapor deposition (or chemical vapor deposition).

Finally, in S105, the N number of first electrodes 501 and the N number of third electrodes 503 may be connected in parallel with each other through electric wires a, respectively, as illustrated in FIG. 2. For example, the first electrodes and third electrodes 501 and 503 of the two negative differential resistance devices 10 and 20 different in resistance value of the serial resistance thin films 400 may be connected in parallel with each other to implement a multi-negative differential resistance device with N number of (e.g., two) peaks and valleys according to the present disclosure. In this case, a serial resistance value of the serial resistance thin films 400 which are the resistive layers 400 may be controlled by varying the length.

As such, a multi-negative differential resistance device with multiple peaks and valleys can be manufactured by parallelly connecting the negative differential resistance devices 10 and 20 and the resistive layers 400 corresponding in number to (N number of) peaks and valleys as desired.

Hereinafter, an explanation of the components that perform the same function as those illustrated in FIG. 4 to FIG. 5D will be omitted.

Figure 6:
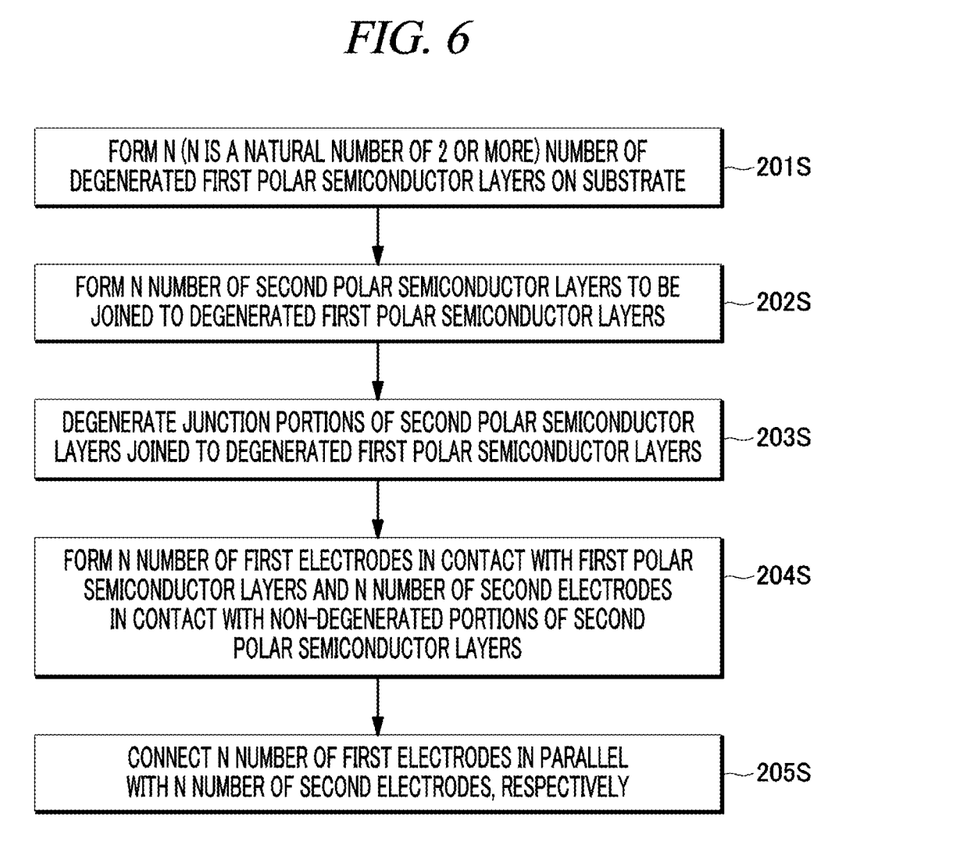
FIG. 6 is a flowchart provided to explain a method of manufacturing the multi-negative differential resistance device illustrated in FIG. 3.

FIG. 6 is a flowchart provided to explain a method of manufacturing the multi-negative differential resistance device illustrated in FIG. 3.

FIG. 7A to FIG. 7D illustrate a detailed process provided to explain the method of manufacturing a multi-negative differential resistance device illustrated in FIG. 6.

Figure 7A:
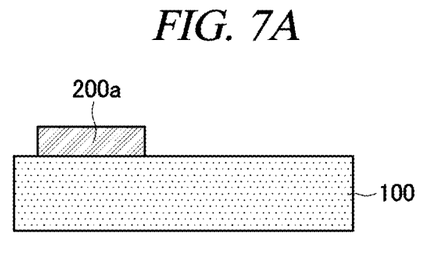
FIG. 7A illustrates a detailed process provided to explain the method of manufacturing a multi-negative differential resistance device illustrated in FIG. 6.
Figure 7B:
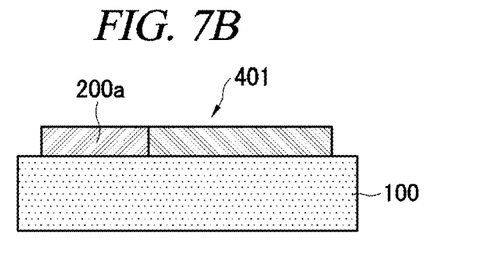
FIG. 7B illustrates a detailed process provided to explain the method of manufacturing a multi-negative differential resistance device illustrated in FIG. 6.
Figure 7C:
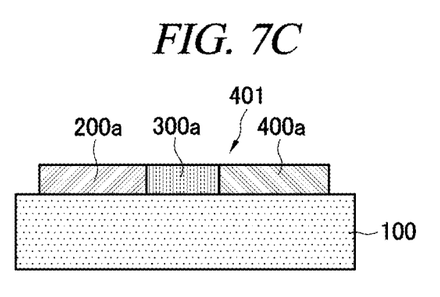
FIG. 7C illustrates a detailed process provided to explain the method of manufacturing a multi-negative differential resistance device illustrated in FIG. 6.
Figure 7D:
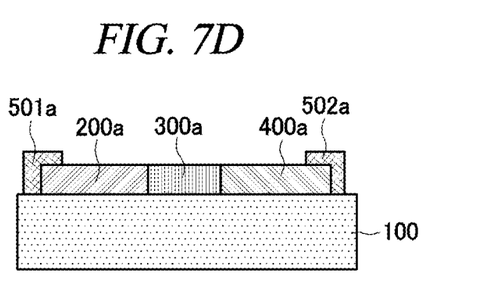
FIG. 7D illustrates a detailed process provided to explain the method of manufacturing a multi-negative differential resistance device illustrated in FIG. 6.

Referring to FIG. 6 to FIG. 7D, the method of manufacturing a multi-negative differential resistance device according to another embodiment of the present disclosure includes forming N (N is a natural number of 2 or more) number of degenerated first polar semiconductor layers 200a on a substrate 100 (S201), forming N number of second polar semiconductor layers 401 to be joined to the degenerated first polar semiconductor layers 200a (S202), degenerating junction portions 330a of the second polar semiconductor layers 401 joined to the degenerated first polar semiconductor layers 200a (S203), forming N number of first electrodes 501a in contact with the first polar semiconductor layers 200a and N number of second electrodes 502a in contact with non-degenerated portions 400a of the second polar semiconductor layers 401 (S204), and connecting the N number of first electrodes 501a in parallel with the N number of second electrodes 502a, respectively (S205).

For example, a method of manufacturing multi-negative differential resistance devices 10a and 20a with N number of (i.e., two) peaks and valleys will be described with reference to FIG. 3, FIG. 6, and FIG. 7A to FIG. 7D. In S201, N number of degenerated P-type semiconductors 200a may be formed on the substrate 100 as illustrated in FIG. 3 and FIG. 7A. Then, in S202, N number of N-type semiconductors 401 may be formed at one ends of the P-type semiconductors 200a or on the P-type semiconductors 200a to be joined to the degenerated P-type semiconductors 200a, and, thus, PN junctions may be formed as illustrated in FIG. 3 and FIG. 7B. Then, in S203, portions 300a of the N-type semiconductors 401 forming a PN junction, i.e., junction portions 300a of the N-type semiconductors 401 joined to the degenerated P-type semiconductors 200a, may be degenerated as illustrated in FIG. 3 and FIG. 7C. For example, the degenerated N-type semiconductors 300a may be formed using ion implantation or an in-situ doping method.

Then, in S204, N number of first electrodes 501a in contact with the P-type semiconductors 200a and N number of second electrodes 502a in contact with non-degenerated portions 400a, i.e., the resistive layers 400a, of the N-type semiconductors 401 may be formed as illustrated in FIG. 3 and FIG. 7D. Finally, the N number of first electrodes 501a and the N number of second electrodes 502a may be connected in parallel with each other through electric wires a, respectively, as illustrated in FIG. 3. For example, a serial resistance value may be controlled by controlling the doping concentration of the non-degenerated portions 400a, i.e., resistive layers 400a, of the N-type semiconductors 401 and the first and second electrodes 501a and 502a of the two negative differential resistance devices 10a and 20a may be connected in parallel with each other to implement a multi-negative differential resistance device with two (or N number of) peaks and valleys.

Figure 8:
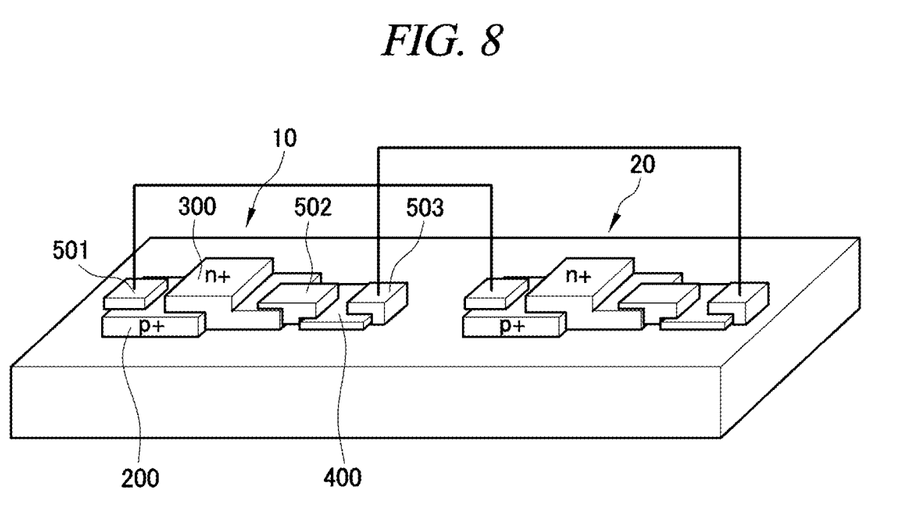
FIG. 8 is a diagram illustrating a structure of a multi-negative differential resistance device including two devices in accordance with various embodiments described herein.

FIG. 8 is a diagram illustrating a structure of a multi-negative differential resistance device including two devices in accordance with an embodiment of the present disclosure.

Figure 9:
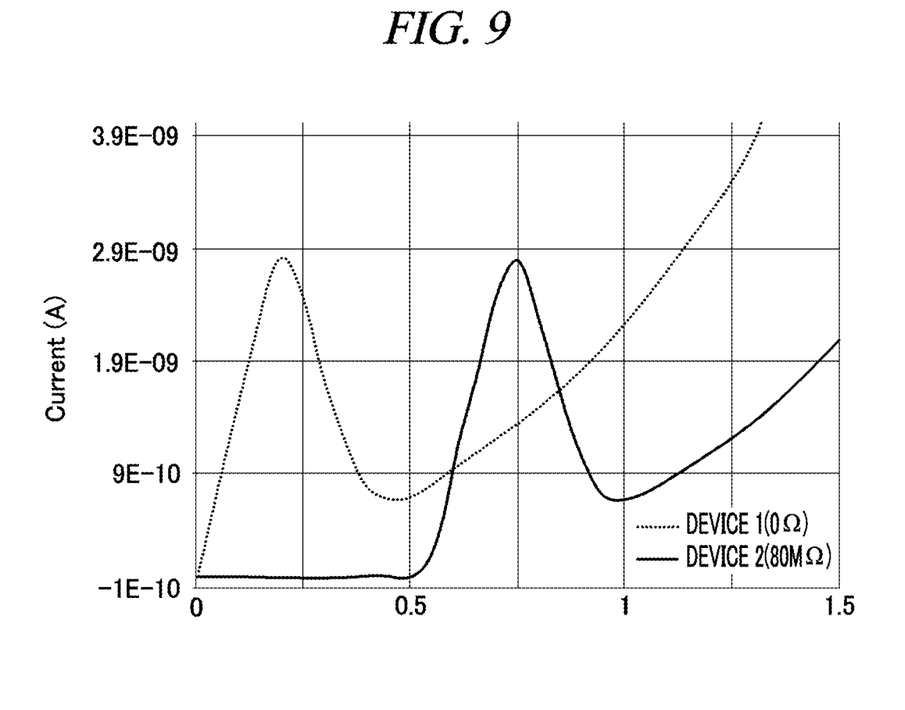
FIG. 9 shows the results of electrical measurements to explain characteristics of the multi-negative differential resistance device illustrated in FIG. 8.
Figure 10:
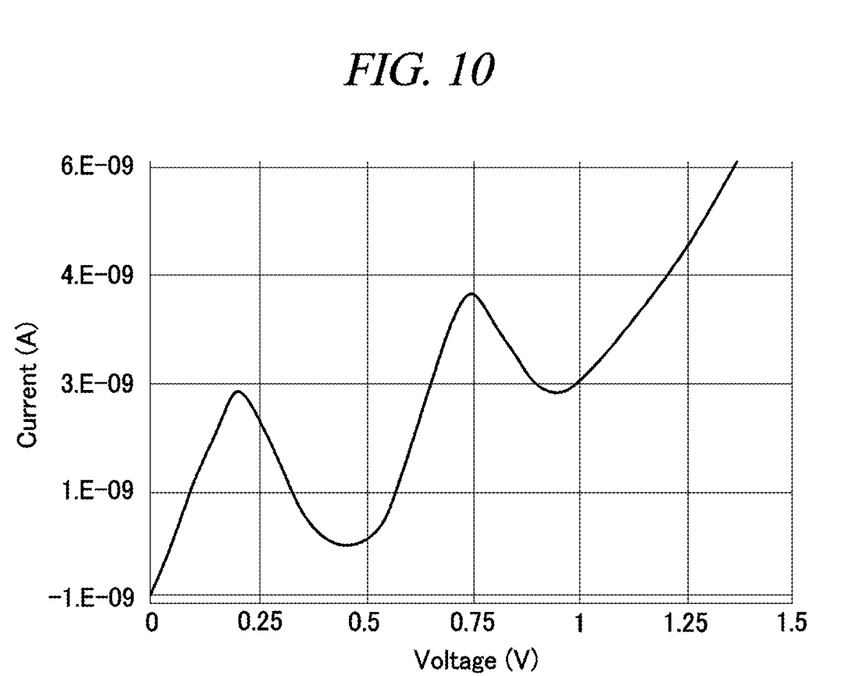
FIG. 10 shows the results of electrical measurements to explain characteristics of the multi-negative differential resistance device illustrated in FIG. 8.

FIG. 9 and FIG. 10 show the results of electrical measurements to explain characteristics of the multi-negative differential resistance device illustrated in FIG. 8.

Hereinafter, the possibility of implementation of a negative differential resistance device of the present disclosure having multiple peaks and valleys by varying a value of a resistance connected in series with the negative differential resistance will be described with reference to FIG. 8 to FIG. 10.

A negative differential resistance current operating model has been developed in consideration of tunneling and diffusion of electrons and includes a tunneling current $I_{tunnel}$ and a diffusion current $I_{diff}$ of a negative differential resistance device as shown in the following Equation 1.

$$I_{tunnel} = \frac{2\pi\alpha q}{h} \int_{Ec_n}^{Ev_p} DOS_p(E)DOS_n(E)[f_p(E)f_n(E - q(V - IR_s))]dE \quad \langle \text{Equation 1} \rangle$$

$$I_{diff} = qI_o\left[\exp\left(\frac{V - IR_s}{\eta k_B T}\right) - 1\right]$$

Herein, $I_{tunnel}$ represents tunneling current, α represents screening factor, q represents elementary quantum of electricity, h represents Planck's constant, $Ev_p$ represents valence band for a p-type semiconductor, $Ec_n$ represents conduction band for an n-type semiconductor, $DOS_p$ and $DOS_n$, represent state densities for p-type and n-type semiconductors, respectively, $f_p$ and $f_n$ represent Fermi-Dirac distribution functions, respectively, $R_s$ represents serial resistance, V represents applied voltage, and I represents current flowing through a device.

Further, $I_{diff}$ represents diffusion current, $I_0$ represents saturated current, $k_B$ represents Boltzmann constant, and η represents ideality factor.

FIG. 8 illustrates a structure of a multi-negative differential resistance device formed of a heterojunction between phosphorene and rhenium disulfide according to an embodiment of the present disclosure. A value of a resistance connected in series with the negative differential resistance devices 10 and 20 was controlled to observe negative differential resistance characteristics with two peaks and valleys.

FIG. 9 illustrates voltage-current curves calculated through a negative differential resistance current analysis model (Equation 1) for two negative differential resistance devices. Herein, a serial resistance value of a first negative differential resistance device Device 1 was set to 0Ω and a serial resistance value of a second negative differential resistance device Device 2 was set to 80 MΩ. As such, the first negative differential resistance device Device 1 shows a negative differential resistance characteristic between 0.3 V and 0.5 V and the second negative differential resistance device Device 2 shows a negative differential resistance characteristic between 0.75 V and 1 V.

FIG. 10 illustrates a voltage-current curve calculated from a circuit in which the two negative differential resistance devices illustrated in FIG. 8 are connected in parallel. It is confirmed that the negative differential resistance devices 10 and 20 with two peaks (around 0.25 V and 0.75 V) and two valleys (around 0.5 V and 1 V) as illustrated in FIG. 10 can be easily implemented by connecting the negative differential resistance devices 10 and 20 with a peak and a valley in parallel and controlling a serial resistance value. As such, it is possible to easily implement a multi-negative differential resistance device of the present disclosure with N number of peaks and valleys by connecting N number of negative differential resistance devices in parallel.

The above description of the present disclosure is provided for the purpose of illustration, and it would be understood by a person with ordinary skill in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and equivalents conceived from the meaning and scope of the claims and their equivalents are included in the scope of the present disclosure.

EXPLANATION OF REFERENCE NUMERALS

10: First negative differential resistance device
20: Second negative differential resistance device
100: Substrate
200, 200a: Degenerated first polar semiconductor/Degenerated p-type semiconductor
300, 300a: Degenerated second polar semiconductor/Degenerated n-type semiconductor
400, 400a: Resistance device/Resistive layer/Resistive thin film
501, 501a: First electrode
502, 502a: Second electrode
503, 503a: Third electrode

We claim:

1. A multi-negative differential resistance device, comprising:
   a first negative differential resistance device; and
   a second negative differential resistance device connected in parallel with the first negative differential resistance device,
   wherein a peak and a valley of the first negative differential resistance device and a peak and a valley of the second negative differential resistance device, as synthesized, result in the multi-negative differential resistance device having two peaks and two valleys,
   wherein each of the first negative differential resistance device and the second negative differential resistance device includes a degenerated first semiconductor and a degenerated second semiconductor joined together.

2. The multi-negative differential resistance device of claim 1, further comprising:

a resistance device connected to any one of the degenerated first polar semiconductor and the degenerated second polar semiconductor.

3. The multi-negative differential resistance device of claim 2, wherein the degenerated first polar semiconductor is formed to have a higher Fermi level than a conduction band due to its very high impurity concentration, and the degenerated second polar semiconductor is formed to have a lower Fermi level than a valence band due to its very high impurity concentration.

4. The multi-negative differential resistance device of claim 1,
wherein the first negative differential resistance device includes:
a first electrode, a second electrode, and a third electrode;
a degenerated p-type semiconductor and a degenerated n-type semiconductor arranged between the first electrode and the second electrode and joined together; and
a resistance device arranged between the second electrode and the third electrode,
the second negative differential resistance device includes:
a first electrode, a second electrode, and a third electrode;
a degenerated p-type semiconductor and a degenerated n-type semiconductor arranged between the first electrode and the second electrode and joined together; and
a resistance device arranged between the second electrode and the third electrode,
the first electrode of the first negative differential resistance device and the first electrode of the second negative differential resistance device are electrically connected, and
the third electrode of the first negative differential resistance device and the third electrode of the second negative differential resistance device are electrically connected.

5. The multi-negative differential resistance device of claim 1,
wherein the first negative differential resistance device includes:
a first electrode and a second electrode; and
a degenerated p-type semiconductor, a degenerated n-type semiconductor, and a resistance device arranged between the first electrode and the second electrode and joined together,
the second negative differential resistance device includes:
a first electrode and a second electrode; and
a degenerated p-type semiconductor, a degenerated n-type semiconductor, and a resistance device arranged between the first electrode and the second electrode and joined together,
the first electrode of the first negative differential resistance device and the first electrode of the second negative differential resistance device are electrically connected, and
the second electrode of the first negative differential resistance device and the second electrode of the second negative differential resistance device are electrically connected.

6. The multi-negative differential resistance device of claim 5,
wherein the degenerated n-type semiconductor and the resistance device are formed by degenerating a junction portion of the n-type semiconductor joined to the degenerated p-type semiconductor.

7. The multi-negative differential resistance device of Claim 1, wherein the degenerated first semiconductor is a degenerated first polar semiconductor and the degenerated second semiconductor is a degenerated second polar semiconductor.

8. A multi-negative differential resistance device,
wherein N number of negative differential resistance devices are connected in parallel with each other, and
peaks and valleys of the respective negative differential resistance devices, as synthesized, result in the multi-negative differential resistance device having N number of peaks and valleys, and
each of the negative differential resistance devices includes a degenerated p-type semiconductor and a degenerated n-type semiconductor joined together and a resistance device connected to any one of the degenerated p-type semiconductor and the degenerated n-type semiconductor.

9. The multi-negative differential resistance device of Claim 8, wherein each of the negative differential resistance device includes a degenerated polar semiconductor.

10. A method of manufacturing a multi-negative differential resistance device, comprising:
forming N (N is a natural number of 2 or more) number of degenerated first polar semiconductor layers on a substrate;
forming N number of degenerated second polar semiconductor layers to be joined to the degenerated first polar semiconductor layers;
forming N number of resistive layers to be adjacent to the second polar semiconductor layers;
forming N number of first electrodes in contact with the first polar semiconductor layers, N number of second electrodes in contact between the second polar semiconductor layers and the resistive layers and N number of third electrodes in contact with the resistive layers; and
connecting the N number of first electrodes in parallel with the N number of third electrodes, respectively.

11. A method of manufacturing a multi-negative differential resistance device, comprising:
forming N (N is a natural number of 2 or more) number of degenerated first polar semiconductor layers on a substrate;
forming N number of second polar semiconductor layers to be joined to the degenerated first polar semiconductor layers;
degenerating junction portions of the second polar semiconductor layers joined to the degenerated first polar semiconductor layers;
forming N number of first electrodes in contact with the first polar semiconductor layers and N number of second electrodes in contact with non-degenerated portions of the second polar semiconductor layers; and
connecting the N number of first electrodes in parallel with the N number of second electrodes, respectively.

* * * * *